United States Patent
Clevenger et al.

(10) Patent No.: US 7,906,428 B2
(45) Date of Patent: Mar. 15, 2011

(54) MODIFIED VIA BOTTOM STRUCTURE FOR RELIABILITY ENHANCEMENT

(75) Inventors: Lawrence A. Clevenger, Lagrangeville, NY (US); Timothy Joseph Dalton, Ridgefield, CT (US); Louis C. Hsu, Fishkill, NY (US); Conal Eugene Murray, Yorktown Heights, NY (US); Carl Radens, Lagrangeville, NY (US); Kwong-Hon Wong, Wappingers Falls, NY (US); Chih-Chao Yang, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 21 days.

(21) Appl. No.: 12/121,216

(22) Filed: May 15, 2008

(65) Prior Publication Data
US 2008/0220608 A1    Sep. 11, 2008

Related U.S. Application Data (60) Continuation of application No. 11/839,258, filed on Aug. 15, 2007, now abandoned, which is a division of application No. 10/964,882, filed on Oct. 14, 2004, now Pat. No. 7,282,802.

(51) Int. Cl.
*H01L 21/4763* (2006.01)
(52) U.S. Cl. ........ 438/643; 438/618; 438/639; 438/653; 257/E21.584
(58) Field of Classification Search .................. 438/618, 438/637, 639, 653, 643; 257/E21.584, E21.586
See application file for complete search history.

(56) References Cited

U.S. PATENT DOCUMENTS

| | | |
|---|---|---|
| 4,484,979 A | 11/1984 | Stocker |
| 4,495,220 A | 1/1985 | Wolf et al. |
| 4,560,436 A | 12/1985 | Bukhman et al. |
| 4,832,788 A | 5/1989 | Nemiroff |
| 4,902,377 A | 2/1990 | Berglund et al. |
| 5,071,518 A | 12/1991 | Pan |
| 5,098,860 A | 3/1992 | Chakravorty et al. |
| 5,308,415 A | 5/1994 | Chou |
| 5,354,712 A | 10/1994 | Ho et al. |
| 5,498,889 A | 3/1996 | Hayden |
| 5,545,927 A | 8/1996 | Farooq et al. |
| 5,891,802 A | 4/1999 | Tao et al. |
| 5,899,740 A | 5/1999 | Kwon |
| 5,904,565 A | 5/1999 | Nguyen et al. |
| 5,933,753 A | 8/1999 | Simon et al. |

(Continued)

*Primary Examiner* — Asok K Sarkar
*Assistant Examiner* — Julia Slutsker
(74) *Attorney, Agent, or Firm* — Scully, Scott, Murphy & Presser, P.C.; Louis J. Percello, Esq.

(57) ABSTRACT

The present invention provides an interconnect structure that can be made in the BEOL which exhibits good mechanical contact during normal chip operations and does not fail during various reliability tests as compared with the conventional interconnect structures described above. The inventive interconnect structure has a kinked interface at the bottom of a via that is located within an interlayer dielectric layer. Specifically, the inventive interconnect structure includes a first dielectric layer having at least one metallic interconnect embedded within a surface thereof; a second dielectric layer located atop the first dielectric layer, wherein said second dielectric layer has at least one aperture having an upper line region and a lower via region, wherein the lower via region includes a kinked interface; at least one pair of liners located on at least vertical walls of the at least one aperture; and a conductive material filling the at least one aperture.

11 Claims, 7 Drawing Sheets

U.S. PATENT DOCUMENTS

| | | | |
|---|---|---|---|
| 6,011,311 A | 1/2000 | Hsing et al. | |
| 6,181,012 B1 | 1/2001 | Edelstein et al. | |
| 6,203,863 B1 | 3/2001 | Lui et al. | |
| 6,465,376 B2 | 10/2002 | Uzoh et al. | |
| 6,498,091 B1 | 12/2002 | Chen et al. | |
| 6,613,666 B2 | 9/2003 | Ma | |
| 6,656,841 B1 | 12/2003 | Kim | |
| 6,686,662 B2 | 2/2004 | Merchant et al. | |
| 6,764,940 B1 * | 7/2004 | Rozbicki et al. | 438/627 |
| 6,828,228 B2 | 12/2004 | Li | |
| 6,905,958 B2 * | 6/2005 | Gracias et al. | 438/643 |
| 2002/0171147 A1 | 11/2002 | Yew et al. | |
| 2003/0087520 A1 * | 5/2003 | Chen et al. | 438/643 |
| 2003/0216037 A1 * | 11/2003 | Zhang et al. | 438/642 |
| 2003/0224595 A1 * | 12/2003 | Smith et al. | 438/637 |
| 2004/0018722 A1 * | 1/2004 | Tarumi et al. | 438/638 |
| 2004/0048461 A1 * | 3/2004 | Chen et al. | 438/629 |
| 2004/0209460 A1 | 10/2004 | Xi et al. | |
| 2005/0064701 A1 | 3/2005 | Dalton et al. | |
| 2005/0118796 A1 * | 6/2005 | Chiras et al. | 438/618 |
| 2006/0024953 A1 | 2/2006 | Papa Rao et al. | |

* cited by examiner

MODIFIED VIA BOTTOM STRUCTURE FOR RELIABILITY ENHANCEMENT

RELATED APPLICATION

This application is a continuation of U.S. application Ser. No. 11/839,258 filed Aug. 15, 2007, now U.S. Patent Application Publication No. 2007/0281469 published on Dec. 6,2007, which is a divisional of U.S. application Ser. No. 10/964,882 filed Oct. 14, 2004, now U.S. Pat. No. 7,282,802 issued on Oct. 16, 2007.

FIELD OF THE INVENTION

The present invention relates to semiconductor integrated circuits (ICs), and more particular to a back-end-of-the-line (BEOL) interconnect that has a modified via bottom structure that enhances the reliability of the IC. Specifically, the present invention provides a BEOL interconnect that has a kink via interconnect structure. The present invention is also related to a method for fabricating the semiconductor IC structure containing the modified via bottom structure.

BACKGROUND OF THE INVENTION

In the semiconductor industry, an interconnect structure is used to provide wiring between devices on an IC chip and the overall package. See, for example, U.S. Pat. Nos. 5,071,518, 5,098,860, 5,354,712, 5,545,927, 5,891,802, 5,899,740, 5,904,565, 5,933,753, 6,181,012 and 6,465,376. In such technology, the devices such as field effect transistors (FETs) are first formed on a surface of a semiconductor substrate and then an interconnect structure is formed in the BEOL. A typical interconnect structure includes at least one dielectric material having a dielectric constant of about 4.0 or lower in which metal patterns in the form of vias and/or lines are embedded therein. The interconnect structure can be either a single damascene structure or a dual damascene structure.

FIGS. 1A-1D illustrate various prior art dual damascene structures. Each of the dual damascene structures shown comprises a first dielectric 100 that includes a metal interconnect or line 110 which extends perpendicular to the plane of the paper. A first patterned cap layer 120 is also present on a surface of the first dielectric 100. A second dielectric 130 is located atop the first dielectric 100. The second dielectric 130 has a dual damascene aperture, which includes a lower portion 148 and an upper portion 150, formed therein. The lower portion 148 is referred to in the art as a via, while the upper portion 150 is referred to in the art as a line. The dielectrics used in each of the levels are typically comprised of silicon dioxide, a thermosetting polyarylene resin, an organosilicate glass such as a carbon-doped oxide (SiCOH), or any other type of hybrid related dielectric. The via 148 makes contact with the underlying interconnect 110, while the line 150 extends over a significant distance to make contact with other elements of the IC as required by the specific design layout. In the drawings, the portion of the cap layer 120 at the bottom of the via 148 has been removed, usually by a different etching chemistry than that used to etch the second dielectric 130. A patterned hard mask 122 is located atop the second dielectric 130.

Figure 1A:
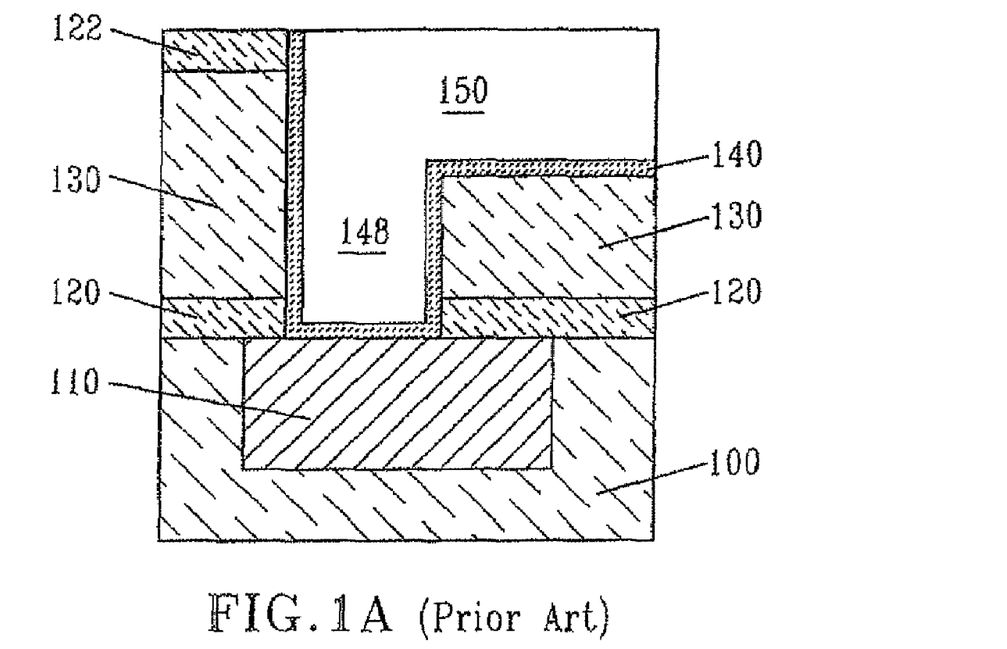
FIGS. 1A-1D are pictorial representations (through cross sectional views) showing various prior art dual damascene interconnect structures.
Figure 1B:
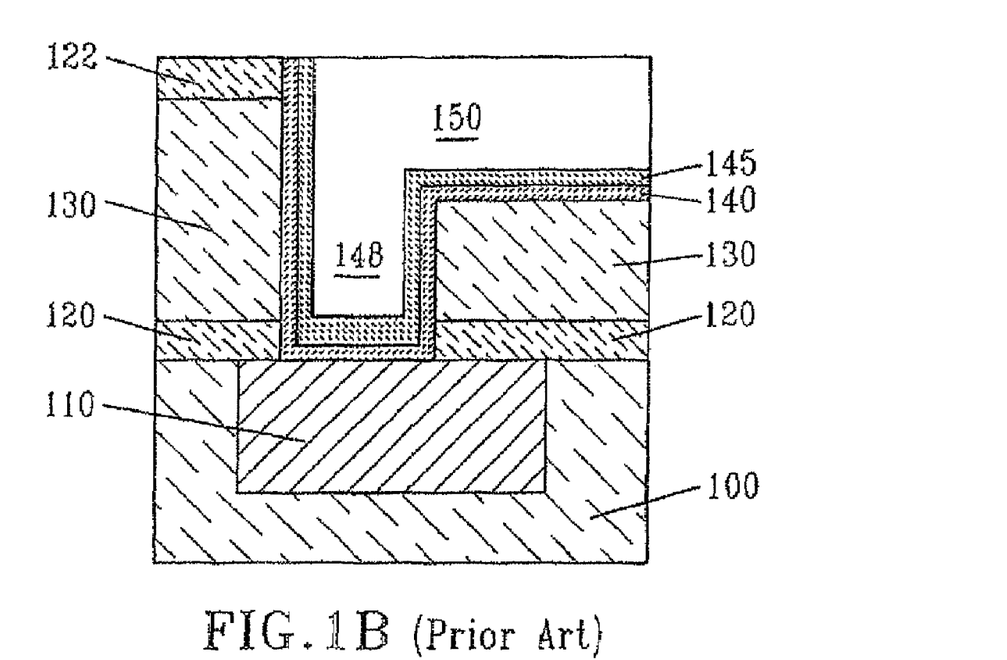
Figure 1C:
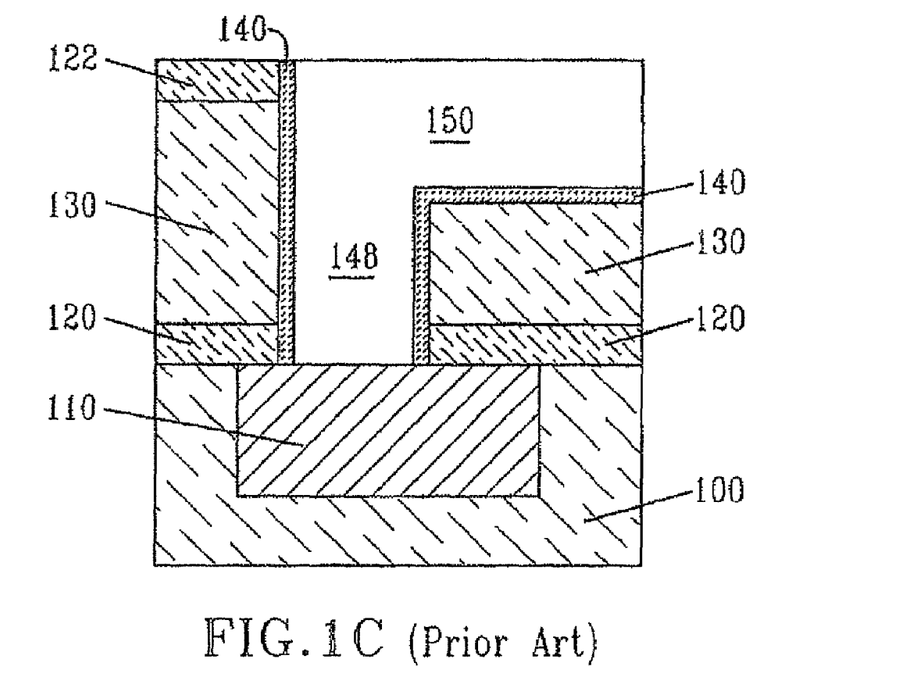
Figure 1D:
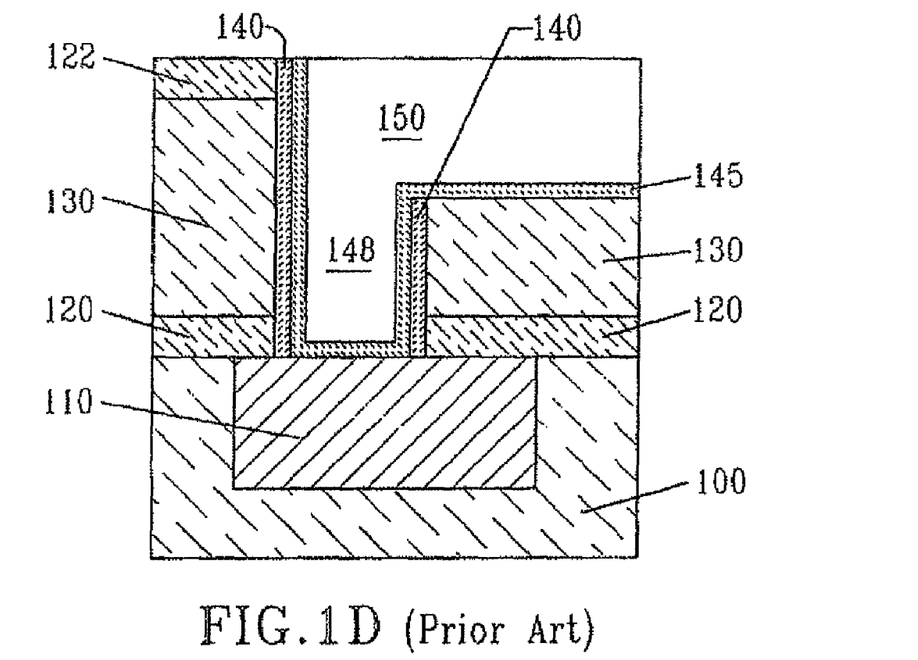

It is conventional in the prior art to deposit a liner 140 over the entire interior of the structure before metallization. Liner 140 can be a single layer such as shown in FIG. 1A and FIG. 1C, or multiple layers 140, 145, as shown in FIGS. 1B and 1D. In FIGS. 1C and 1D, the liner 140 is not located on the bottom horizontal surface of the via 148. The liner 140, 145 is comprised of a refractory metal such as, for example, Ta, Ti, and W, or a refractory metal nitride such as TaN, TiN, and WN. An optional adhesion layer, not specifically shown, can be used to enhance the bonding of the liner to the second dielectric layer 130.

A conductive material (not specifically shown) such as Al, W, Cu or alloys thereof is then deposited so as to completely fill the aperture providing conductively filled vias and conductively filled lines.

One major problem with the prior art interconnect structures shown in FIGS. 1A-1D is that it is difficult to obtain a good mechanical contact at normal chip operation temperatures. Additionally, the prior art interconnect structures oftentimes exhibit an open circuit or high resistance joint during reliability testing. Hence, there is a need for providing a new and improved interconnect structure that avoids the problems mentioned above. That is, an interconnect structure is needed that has and maintains good mechanical contact during normal chip operations and does not fail during various reliability tests such as thermal cycling and high temperature baking.

SUMMARY OF THE INVENTION

The present invention provides an interconnect structure that can be made in the BEOL which exhibits good mechanical contact during normal chip operations and does not fail during various reliability tests as compared with the conventional interconnect structures described above. The inventive interconnect structure has a kink interface at the bottom of a via that is located within an interlayer dielectric layer.

In broad terms, the inventive interconnect structure comprises:

a first dielectric layer having at least one metallic interconnect embedded therein;

a second dielectric layer located atop said first dielectric layer, wherein said second dielectric layer has at least one aperture having an upper line region and a lower via region, said lower via region includes a kinked interface;

at least a pair of liners located on at least vertical walls of said at least one aperture; and a conductive material filling said at least one aperture.

Figure 8:
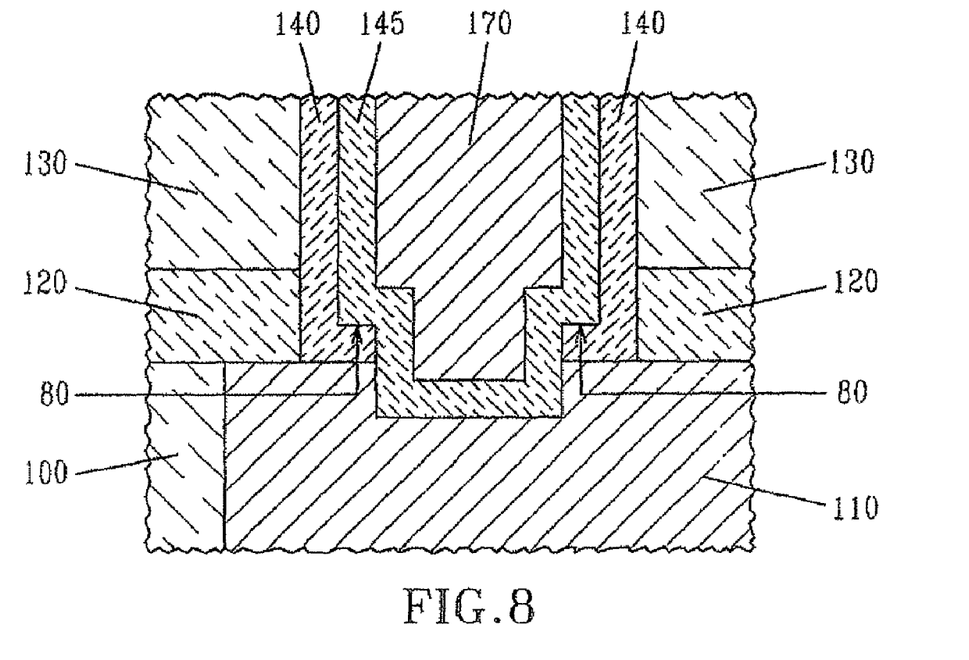
FIG. 8 is an enlarged view of the dual damascene structure shown in FIG. 6 highlighting the kinked interface formed in the bottom via surface after filling the at least one aperture with a conductive material.
Figure 9:
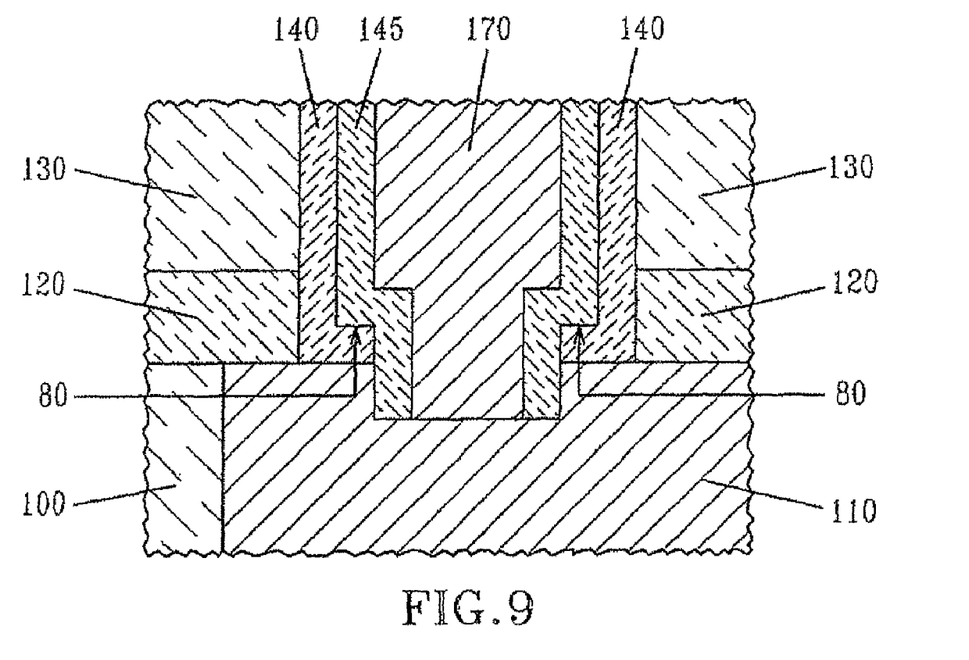
FIG. 9 is an enlarged view of the open-bottom dual damascene structure shown in FIG. 7 highlighting the kinked interface formed in the bottom via surface after filling the at least one aperture with a conductive material.

The term "kinked interface" is used herein to denote the step shape like interface structure 80 shown in FIGS. 8 and 9.

The present invention also provides a method for fabricating the via kinked interface interconnect structure described above. Specifically, and in broad terms, the method of the present invention includes the steps of:

forming a second dielectric layer atop a first dielectric layer having a metallic interconnect embedded therein;

forming at least one aperture within said second dielectric layer that extends to the metallic interconnect in said first dielectric layer;

forming a liner material in said at least one aperture;

partially removing said liner material at a bottom surface of said at least one aperture to create a kinked interface, while simultaneously depositing a second liner; and forming a conductive material in said at least one aperture including said kinked interface.

DETAILED DESCRIPTION OF THE INVENTION

The present invention, which provides an interconnect structure having a modified via bottom structure for reliability enhancement as well as a method of fabricating the same, will now be described in greater detail by referring to FIGS. 2-10. It is noted that FIGS. 2-10 are provided for illustrative purposes and thus they are not drawn to scale.

Figure 2:
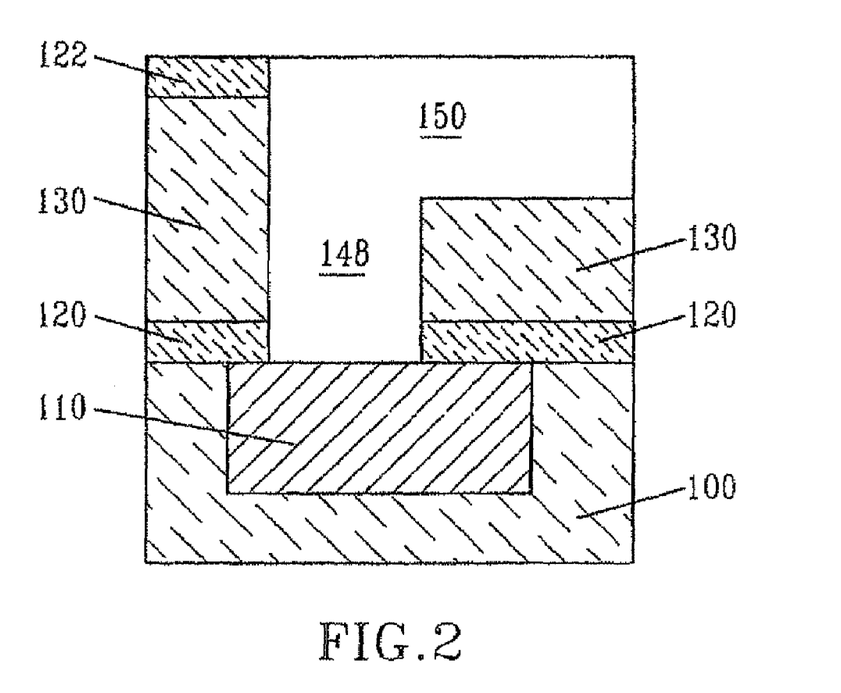
FIG. 2 is a pictorial representation (through a cross sectional view) showing a dual damascene structure of the present invention after forming at least one aperture within the second dielectric layer.

Reference is first made to the partial interconnect structure shown in FIG. 2 which includes a first (or lower) dielectric layer 100 having a conductive interconnect 110 embedded within a surface of the first dielectric layer 100 and an optional patterned cap 120 having an opening that exposes a surface of the conductive interconnect 110 located on the first dielectric layer 100. The partial interconnect structure shown in FIG. 2 also includes a second dielectric layer 130 that has an optional patterned hard mask 122 located on a surface of the second dielectric layer 130. The second dielectric layer 130 has at least one aperture that comprises an upper line region 150 and a bottom via region 148.

The partial interconnect structure is formed by first forming the first dielectric layer 100 on a substrate (not shown) that includes at least one semiconductor device (also not shown). The at least one semiconductor device includes, for example, a PFET, NFET or a combination thereof. The first dielectric layer 100 is formed by a deposition process including, for example, chemical vapor deposition (CVD), plasma enhanced chemical vapor deposition (PECVD), chemical solution deposition or spin-on coating.

The first dielectric layer 100 comprises any insulator (porous or non-porous) that has a dielectric constant k of about 4.0 or less. Illustrative examples of such dielectric materials having a dielectric constant within the recited range include, but are not limited to: $SiO_2$, a thermosetting polyarylene resin, an organosilicate glass (OSG) such as a carbon doped oxide that includes atoms of Si, C, O and H, and other like insulators. The term "polyarylene" is used herein to denote aryl moieties or inertly substituted aryl moieties which are linked together by bonds, fused rings, or inert linking groups such as oxygen, sulfur, sulfone, sulfoxide, carbonyl, etc.

The thickness of the first dielectric layer 100 can vary depending upon the type of insulator employed as well as the type of process used to deposit the same. Typically, the first dielectric layer 100 has a thickness from about 50 to about 500 nm, with a thickness from about 100 to about 300 nm being more typical.

The metallic interconnect 110, which is embedded within the first dielectric layer 100, extends perpendicular to the plane of the paper. The metallic interconnect 110 is comprised of a conductive metal including, for example, copper (Cu), aluminum (Al), and tungsten (W), or an alloy containing at least a conductive metal. In a preferred embodiment, the metallic interconnect 10 is comprised of Cu.

The metallic interconnect 110 is formed in the surface of the first dielectric layer 100 by lithography and etching. The lithography step includes forming a blanket layer of resist material (not shown) on the surface of the first dielectric layer 100, exposing the blanket resist material to a pattern of radiation and developing the pattern into the resist utilizing a conventional resist developer. The etching step includes any etching process that selectively removes some of the exposed portion of the underlying first dielectric layer 100. Illustratively, the etching used at this point of the present invention includes a dry etching process such as, for example, reactive-ion etching, ion beam etching, plasma etching or combinations thereof. The lithography and etching steps define an opening into the first dielectric layer 100 in which the metallic interconnect 110 will be subsequently formed.

Next, a conductive metal such as described above is formed into the at least one opening using a conventional deposition process including, but not limited to: CVD, PECVD, sputtering, chemical solution deposition or plating. A conventional planarization process such as chemical mechanical polishing (CMP) or grinding can be employed after depositing the conductive metal. The planarization process provides a structure in which the metal interconnect 110 has an upper surface that is substantially coplanar with the upper surface of the first dielectric layer 100.

In some embodiments, and when Cu is employed, a cap layer 120 is deposited on the surface of the first dielectric layer 100 after forming the metallic interconnect 110. The optional cap layer 120 comprises a nitride, oxynitride or any combination thereof. The optional cap layer 120 is formed by a deposition process or by a thermal nitridation or oxynitridation process. The optional cap layer 120 typically has a thickness from about 5 to about 90 nm, with a thickness from about 20 to about 60 nm being more typical.

After providing the conductive interconnect 110 into the first dielectric layer 100 (with or without the cap layer 120), a second dielectric layer 130 that may comprise the same or different dielectric material as the first dielectric layer 100 is formed. The second dielectric layer 130 is formed utilizing one of the above mentioned deposition processes that was used in forming the first dielectric layer 100. The thickness of the second dielectric layer 130 may vary depending on the type of dielectric material employed as well as the process used in forming the same. Typically, the second dielectric layer 130 has a thickness from about 200 to about 900 nm, with a thickness from about 400 to about 700 nm being even more typical.

An optional hard mask 122 is then formed atop the second dielectric layer 130. The optional hard mask 122 is typically used when Cu is to be embedded within the second dielectric layer 130. The optional hard mask 122 is comprised of the same or different material as the cap layer 120. The optional hard mask 122 has a thickness that is within the ranges mentioned above for the cap layer 120.

Another resist material (not shown) is then formed atop either the optional hard mask 122 or the second dielectric layer 130 and then lithography is used to provide a patterned resist material. The pattern formed at this point is a via pattern. Next, the via pattern is transferred into the optional hard mask 122, if present, and thereafter into the second dielectric layer 130. The patterned resist is typically removed after the optional hard mask 122 has been etched. The via 148 extends to the surface of the conductive interconnect 110. Hence, if the cap layer 120 is present, it is etched during this step of the present invention. The etching step is similar to the etching step described above in forming the conductive interconnect 110. Specifically, the etching step selectively etches the hard mask 122, the second dielectric layer 130 and, if present the cap layer 120 stopping on a surface of the conductive interconnect 110.

A yet other resist material is then applied and patterned by lithography to provide a line pattern which is transferred into the hard mask 122 and a portion of the second dielectric layer 130 utilizing an etching process. The line pattern is formed into an upper portion of the second dielectric layer 130. In FIG. 2, reference numeral 150 denotes the line. It is noted that the line 150 and via 148 form an aperture within the second dielectric 130 that extends to the upper surface of the conductive interconnect 110.

In some embodiments of the present invention, the line 150 can be formed first and then the via 148 can be formed.

Figure 3:
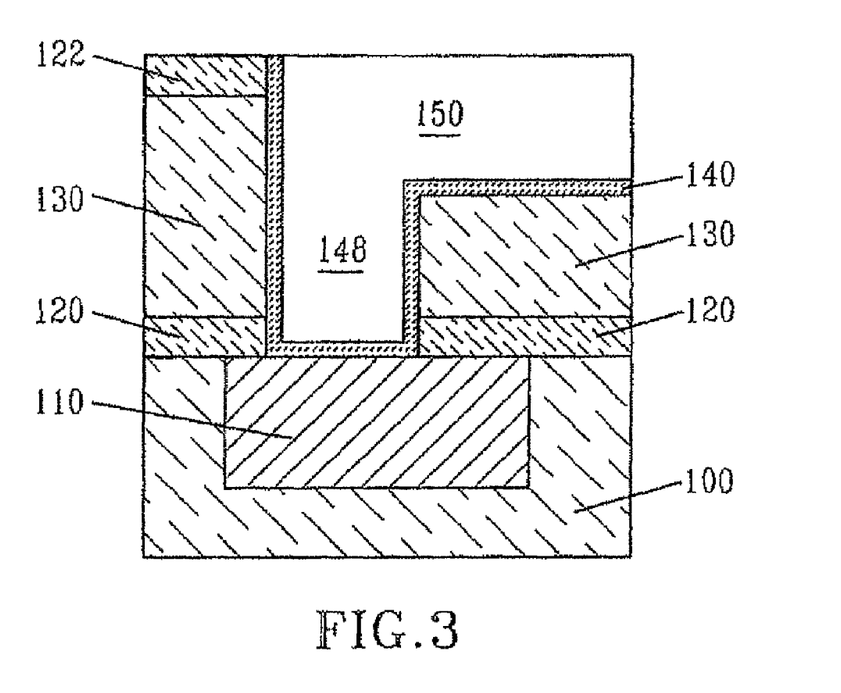
FIG. 3 is a pictorial representation (through a cross sectional view) showing the dual damascene structure of FIG. 2 after forming a liner material within the at least one aperture.

A first liner 140 is then formed on all exposed surfaces (vertical and horizontal) within the aperture created above so as to provide the structure shown in FIG. 3. The first liner 140 is formed by any deposition process including, but not limited to: CMVD, PECVD, sputtering, chemical solution deposition or plating. The first liner 140 is comprised of any material that can serve as a barrier to prevent a conductive material from diffusing there through. Illustrative examples of such barrier materials include a refractory metal, such as Ta, Ti, W, Ru, or nitrides thereof, e.g., TaN, TiN, WN. The first liner 140 may also comprise TiNSi. The thickness of the first liner 140 is typically from about 5 to about 60 nm, with a thickness from about 10 to about 40 nm being more typical.

Figure 4:
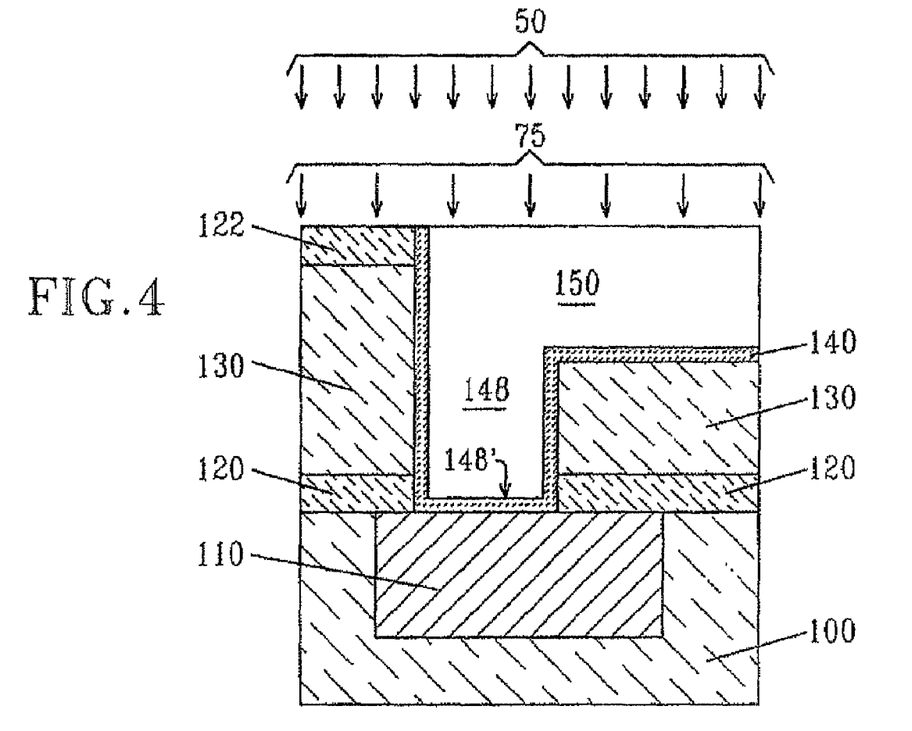
FIG. 4 is a pictorial representation (through a cross sectional view) showing the dual damascene structure of FIGS. 3 during a simultaneous etching and deposition process.

FIG. 4 shows the structure during simultaneous etching of the first liner 140 from substantially all horizontal surfaces within the aperture and deposition of second liner material. In FIG. 4, reference numeral 50 is used for sputtered ions that are used to etch the first liner 140 from substantially all of the horizontal surfaces within the aperture, while reference numeral 75 denotes the metal neutral of the second liner being deposited. Specifically, the second liner is being deposited with simultaneous ion bombardment which is used to etch the first liner from substantially all of the horizontal surfaces within the aperture. The gas used in ion bombardment includes one of Ar, He, Ne, Xe, $N_2$, $H_2$, $NH_3$ or $N_2H_2$. The second liner formed during the step includes Ta, TaN, Ti, TiN, TiNSi, W, WN, or Ru.

Because the field and trench bottom have higher metal neutral deposition rates than the via bottom 148', a negative etching rate can be achieved at these areas, while a positive etching rate is maintained at via bottom 148'. Thus, the gaseous sputtering partially removes the first deposited liner 140 and the underlying interconnect 110 from the via bottom, without damaging the other areas, i.e., field and trench bottom.

Figure 5:
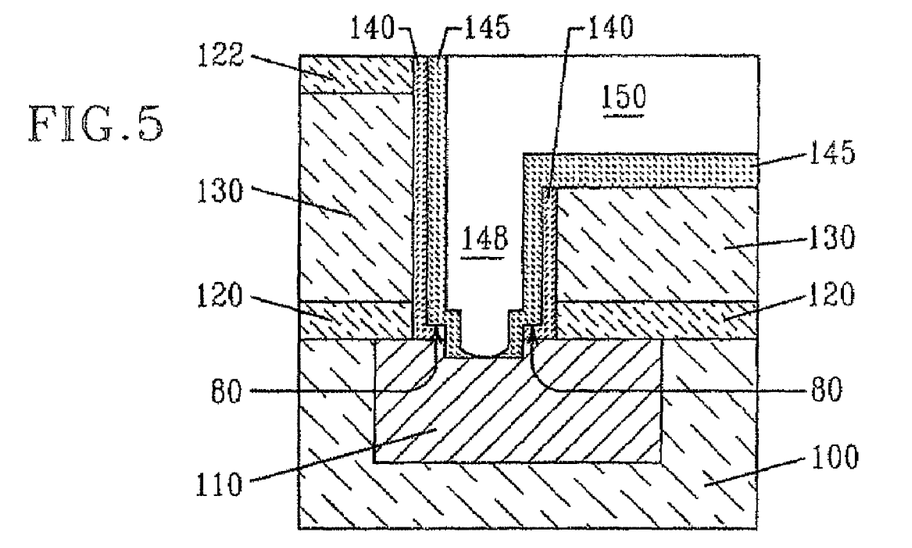
FIG. 5 is a pictorial representation (through a cross sectional view) showing the dual damascene structure after the simultaneous etching and deposition process depicted in FIG. 4 has been performed.

FIG. 5 shows the interconnect structure after the simultaneous ion etching and metal neutral deposition process depicted in FIG. 4 has been performed. As shown, the ion bombardment, i.e., etching, does not completely remove all of the first liner 140 from the bottom via surface 148. Instead, a portion of the liner 140 is left on the bottom wall of the via. The remaining portion of the first liner within the bottom wall of the via 148 provides a kinked interface 80 within the inventive structure. FIG. 5 also shows the interconnect structure after deposition of the second liner 145. The second liner 145 covers the extensive horizontal surface of the line 150 in order to properly confine the conductive material to be subsequently formed within the aperture (e.g., kinked via 148 and line 150). It is possible to have a small amount of the first liner 140 left at the trench bottom 150 (not shown). The bottom surface of the now kinked via 148 is shown as being only partially covered with the second liner 145 to illustrate that the complete coverage within this region is not essential. That is, complete coverage of the kinked via 148 is not required, i.e., it can be either filly covered with the second liner 145 or partially covered. Because the deposition rate is typically higher within the upper liner region 150 than at the bottom of the via 148, the second liner 145 generally has a better (thicker) coverage within the line 150 as compared with the via 148.

Figure 6:
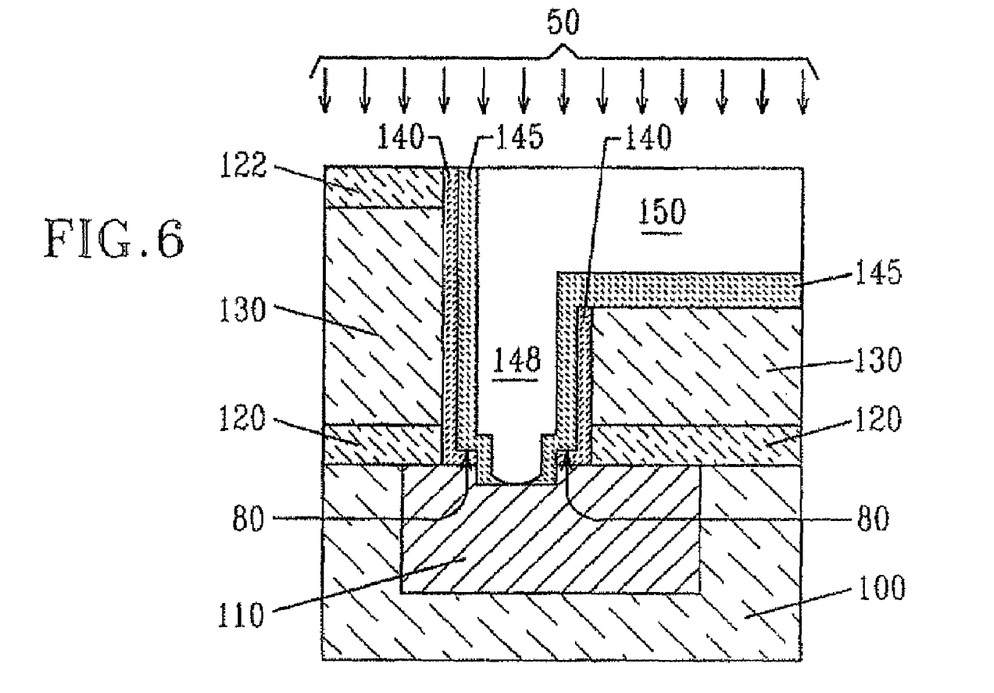
FIG. 6 is a pictorial representation (through a cross sectional view) showing the dual damascene structure of FIG. 5 during an optional sputtering process.
Figure 7:
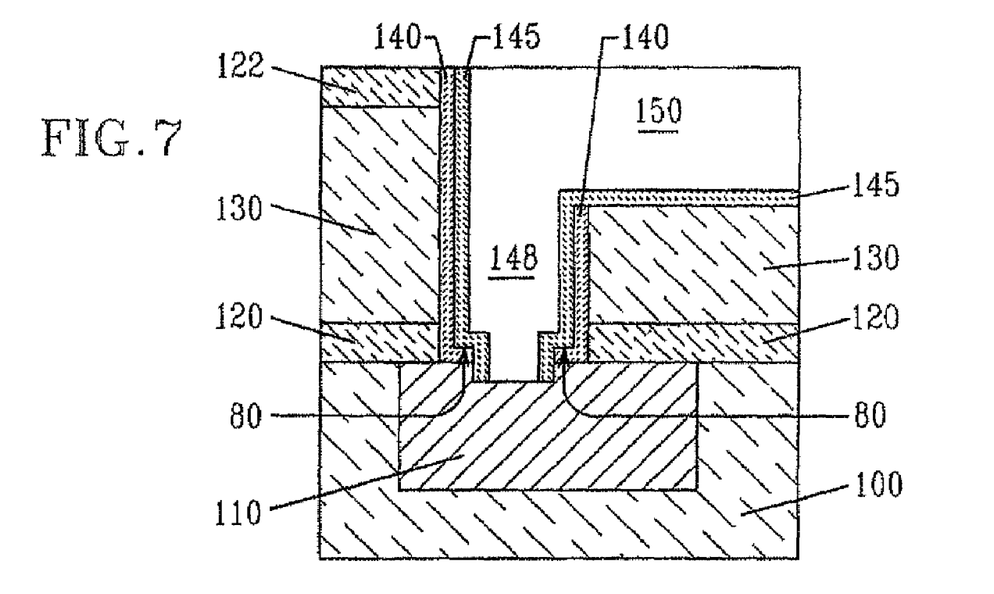
FIG. 7 is a pictorial representation (through a cross sectional view) showing the dual damascene structure after the optional sputtering step shown in FIG. 6 has been performed.

FIG. 6 shows an optional second directional ion bombardment step that can be used to remove the second liner 145 from the bottom wall of the kinked via 148 so as to provide the structure shown in FIG. 7. The optional second ion bombardment step thus provides a structure, see FIG. 7, having an open, yet kinked, via bottom. Because the second liner 145 typically has a higher resistivity than the conductive material to be subsequently deposited within the aperture (via 148 and line 150) and impurities may be deposited in the via bottom, which both increase electrical resistance of the joint, it is preferred to employ this optional second ion bombardment step.

The optional second ion bombardment step is performed utilizing one of the gases mentioned above and the conditions for the optional step include 5 to 30 nm silicon oxide equivalent removal thickness.

Next, and as shown in FIGS. 8 and 9, a conductive material is deposited within the aperture to completely fill the kinked via 148 and the line 150. The conductive material is denoted by reference numeral 170 in these drawings. The conductive material 170 comprises polySi, a conductive metal, an alloy comprising at least one conductive metal, a conductive metal silicide or combinations thereof Preferably, the conductive material 170 is a conductive metal such as Cu, W, or Al. In one highly preferred embodiment, the conductive material 170 is comprised of Cu. The conductive material 170 is formed within the aperture utilizing a conventional deposition process including, but not limited to: CVD, PECVD, sputtering, chemical solution deposition or plating. After deposition, a planarization process can be employed such that the upper surface of the conductive material 170 is substantially coplanar with either the upper surface of the second dielectric layer 130 or, if present, the upper surface of the optional hard mask 122. Note that FIGS. 8 and 9 are enlarged views emphasizing the kinked via 148 therefore the upper region of the interconnect structure is not shown.

Figure 10:
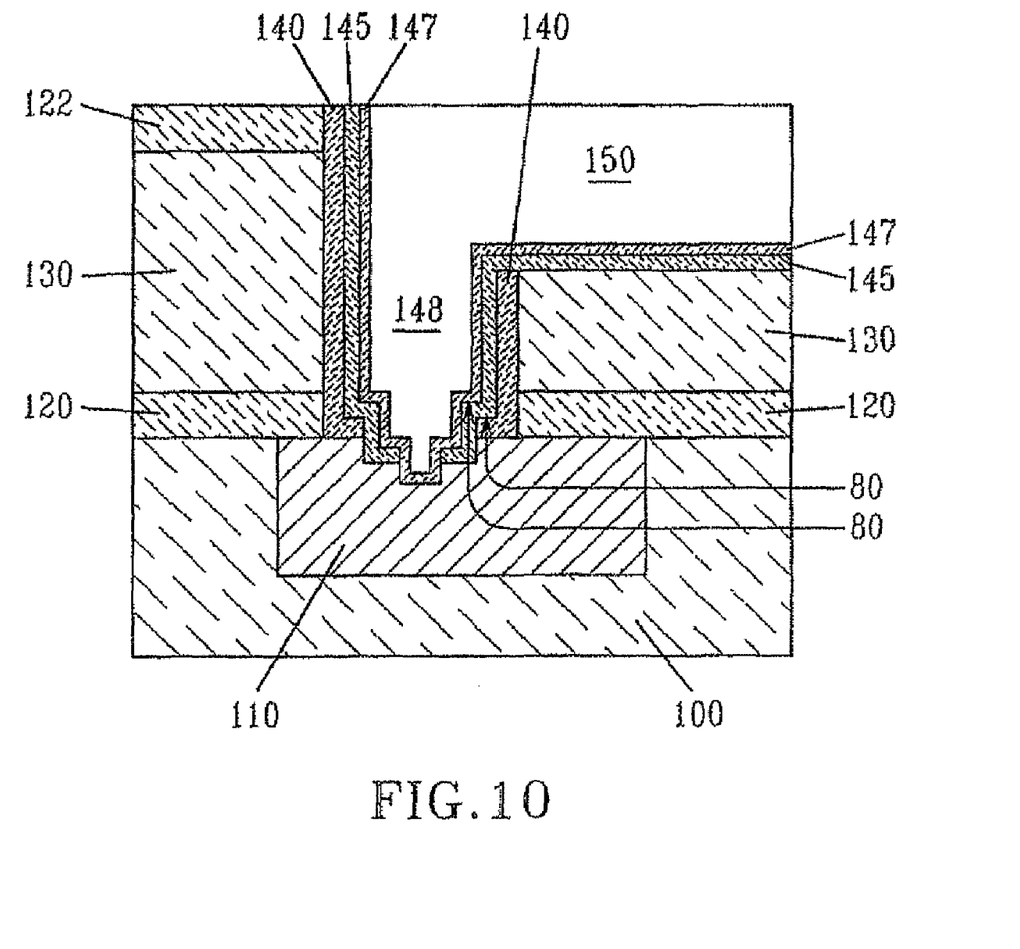
FIG. 10 is a pictorial representation (through a cross sectional view) illustrating an embodiment after repeating the simultaneous etching and deposition process mentioned in FIG. 4 so as to deposit three layers of liner within the at least one aperture.

FIG. 10 shows a resultant structure after repeating the process shown in FIG. 4 twice. In this embodiment, three liners 140, 145 and 147 are present in the interconnect structure. Note that kinked interfaces are formed at the bottom of the via including liners 140 and 145. Liner 147 is comprised of the same or different material as liner 145. It is noted that the present invention is not limited to just repeating the simultaneous etching and metal neutral deposition process twice, instead this step can be repeated any number of times. The limitation of repeating the etching and deposition step is, however, limited to the width of the kinked via 148.

It should be noted that in the above drawings only a single interconnect 110 and a single aperture are shown. Despite showing the presence of a single interconnect 110 and a single aperture, the present invention contemplates forming numerous interconnect and apertures within an interconnect structure. Moreover, it is also contemplated to form addition dielectrics containing embedded conductive material atop the structures depicted in FIGS. 8 and 9 to provide multilevel interconnect structures.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention is not limited to the exact forms and details described and illustrated, but fall within the scope of the appended claims.

What is claimed is:

1. A method of forming an interconnect structure having a modified via bottom structure comprising:

forming a second dielectric layer atop a first dielectric layer having a metallic interconnect embedded therein;

forming at least one aperture within said second dielectric layer that extends to the metallic interconnect in said first dielectric layer;

forming a liner material in said at least one aperture;

forming an L-shaped liner by partially removing said liner material at a bottom surface of said at least one aperture and recessing an upper surface of the metal interconnect, wherein a remaining portion of said liner material is located on a portion of the upper surface of said metallic interconnect that is not recessed, wherein the remaining portion of the liner material and the upper surface of the metal interconnect that is recessed defines a kinked interface of said L-shaped liner within a bottom portion of said at least one aperture that protrudes from a sidewall of said at least one aperture, while simultaneously depositing a second liner on an upper surface of said L-shaped liner including atop said kinked interface and the upper surface of the metal interconnect that is recessed; and forming a conductive material in said at least one aperture including said kinked interface.

2. The method of claim 1 wherein said forming said at least one aperture comprises forming a via opening and a line opening, wherein said via opening is formed prior to said line opening.

3. The method of claim 1 wherein said forming said at least one aperture comprises forming a via opening and a line opening, wherein said line opening is formed prior to said via opening.

4. The method of claim 1 wherein a patterned cap layer is formed on a surface of said first dielectric layer prior to forming said second dielectric layer.

5. The method of claim 1 wherein said partially removing said liner material and simultaneous deposition includes ion bombardment and sputtering.

6. The method of claim 5 wherein said ion bombardment includes one of Ar, He, Ne, Xe, $N_2$, $H_2$, $NH_3$ or $N_2H_2$.

7. The method of claim 6 wherein said ion bombardment leaves a portion of said first liner on a bottom wall of said via so as to form said kinked interface.

8. The method of claim 1 wherein said step of partially removing said liner material and simultaneous deposition is repeated at least once.

9. The method of claim 1 further comprising a sputter process which is performed after said partially removing said liner material and simultaneous deposition step.

10. The method of claim 1 further comprising forming a patterned hard mask atop said second dielectric layer prior to said forming said at least one aperture.

11. The method of claim 1 wherein said metallic interconnect and said conductive material both comprise Cu.

* * * * *